United States Patent
Lützen

(10) Patent No.: US 6,756,626 B2
(45) Date of Patent: Jun. 29, 2004

(54) TRENCH CAPACITOR HAVING AN INSULATION COLLAR

(75) Inventor: Jörn Lützen, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/962,576

(22) Filed: Sep. 24, 2001

(65) Prior Publication Data

US 2002/0036310 A1 Mar. 28, 2002

(30) Foreign Application Priority Data

Sep. 23, 2000 (DE) .......................................... 100 47 221

(51) Int. Cl.⁷ ...................... H01L 27/108; H01L 29/76; H01L 29/94; H01L 31/119
(52) U.S. Cl. ........................................ 257/301; 257/302
(58) Field of Search ................................ 257/301–302, 257/296; 438/242–243, 286

(56) References Cited

U.S. PATENT DOCUMENTS 6,018,174 A     1/2000   Schrems et al.
6,194,755 B1 *  2/2001   Gambino et al. ........... 257/301
6,236,079 B1 *  5/2001   Nitayama et al. ........... 257/306

FOREIGN PATENT DOCUMENTS

EP          0 971 414 A1      1/2000

* cited by examiner

*Primary Examiner*—Cuong Nguyen
(74) *Attorney, Agent, or Firm*—Laurence A. Greenberg; Werner H. Stemer; Gregory L. Mayback

(57) ABSTRACT

A trench capacitor has a bottle-shaped trench in a semiconductor substrate. The bottle-shaped trench has a wider lower region and a narrower upper region. An outer electrode layer is formed in the semiconductor substrate around a lower section of the wider lower region of the trench. A dielectric intermediate layer is provided on the lower section of the trench wall in the wider lower region of the trench. A first, thick insulation layer, which adjoins the dielectric intermediate layer, is provided on an upper section of the trench wall in the wider lower region of the trench. A second, thin insulation layer, which adjoins the first thick insulation layer, is formed on the trench wall in the narrower upper region of the trench. An inner electrode layer substantially fills the trench. A method of producing a trench capacitor is also provided.

7 Claims, 8 Drawing Sheets

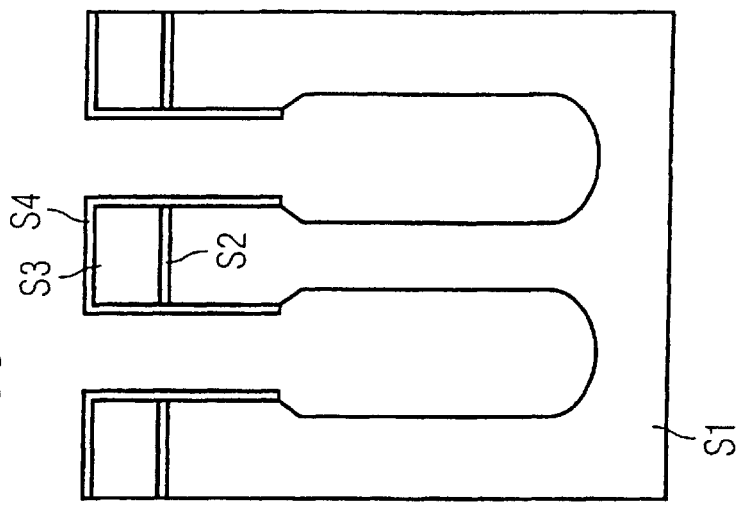
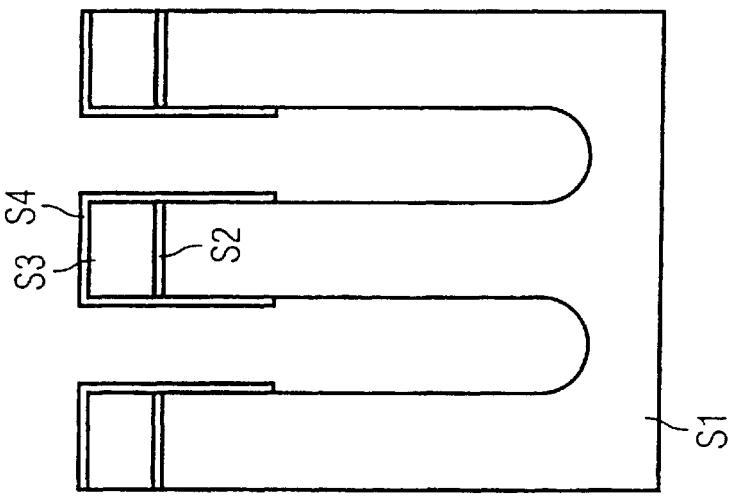
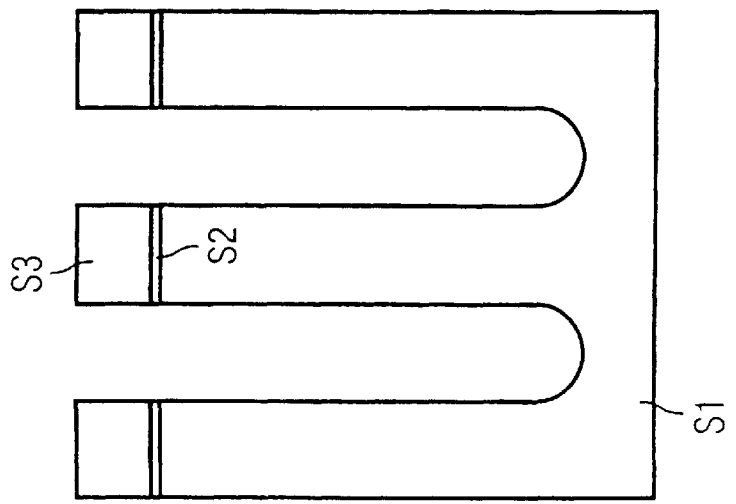

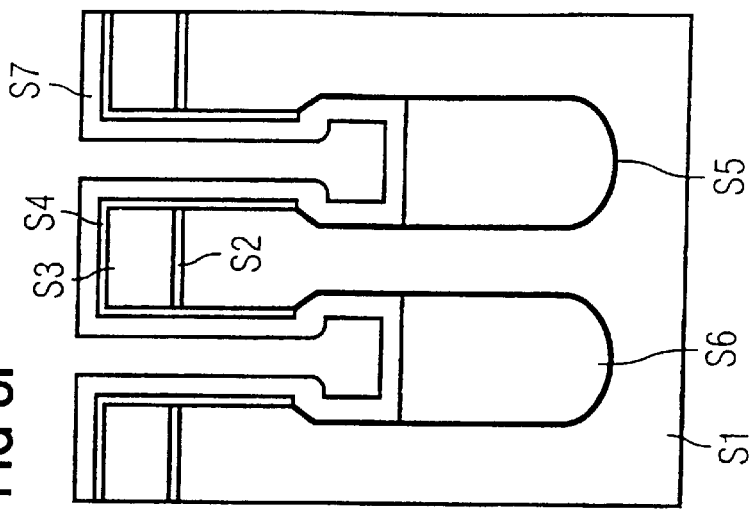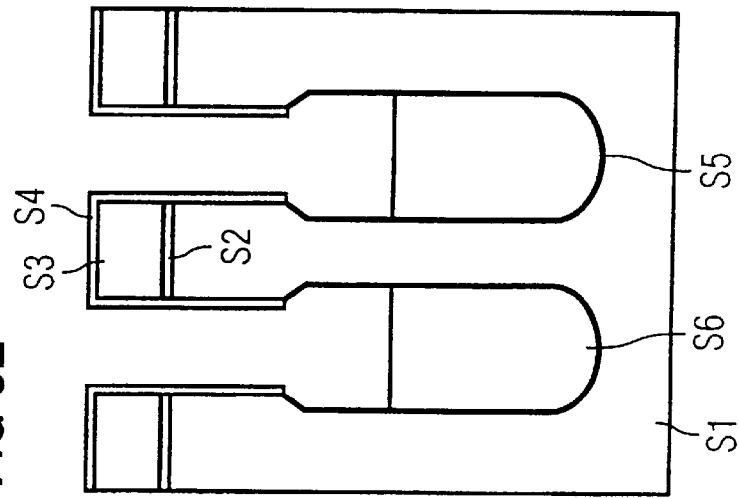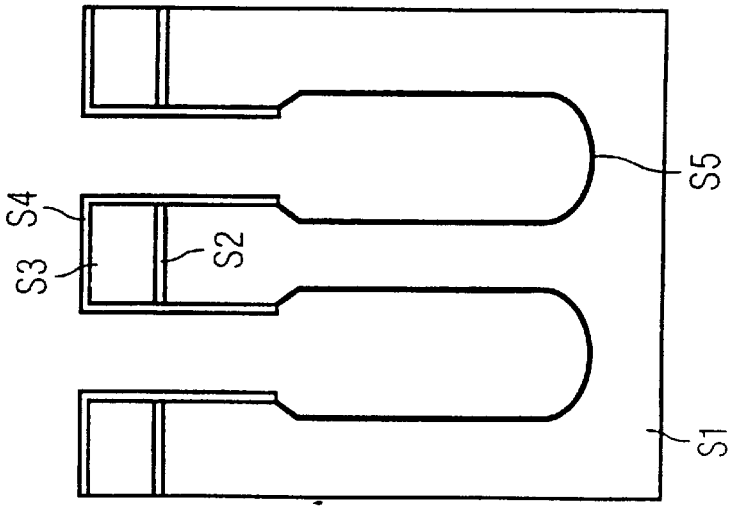

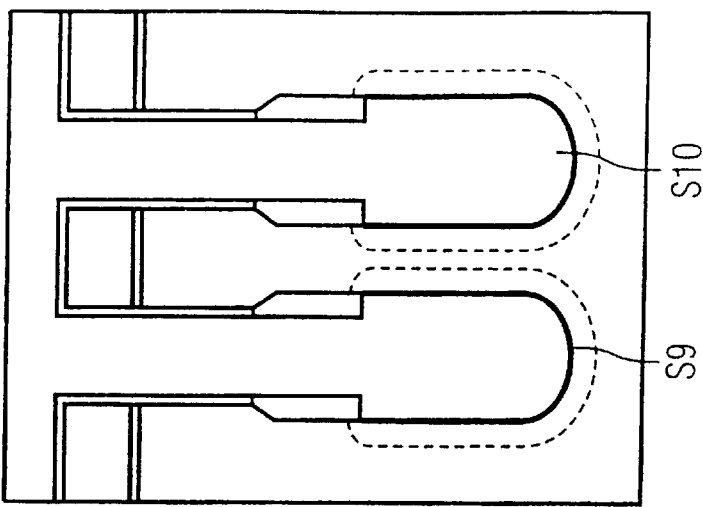
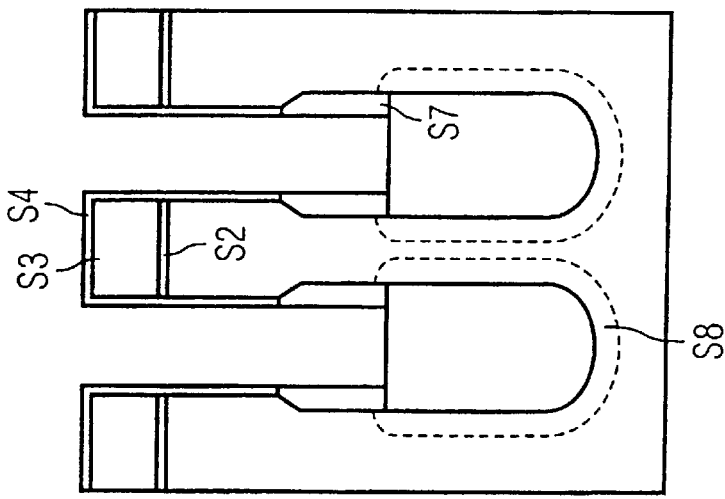
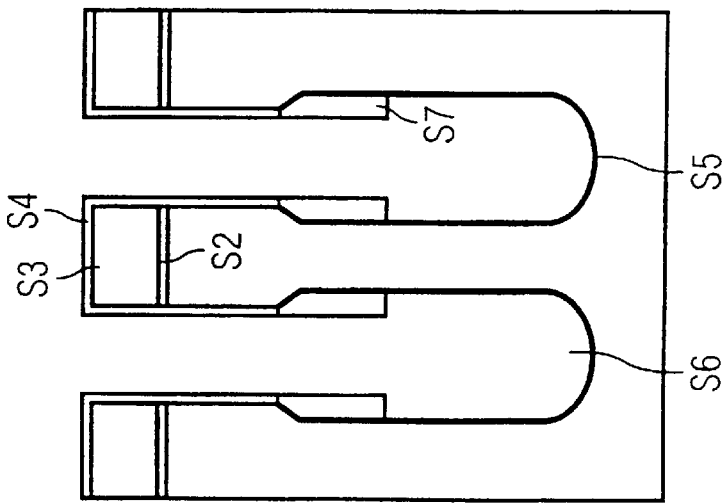

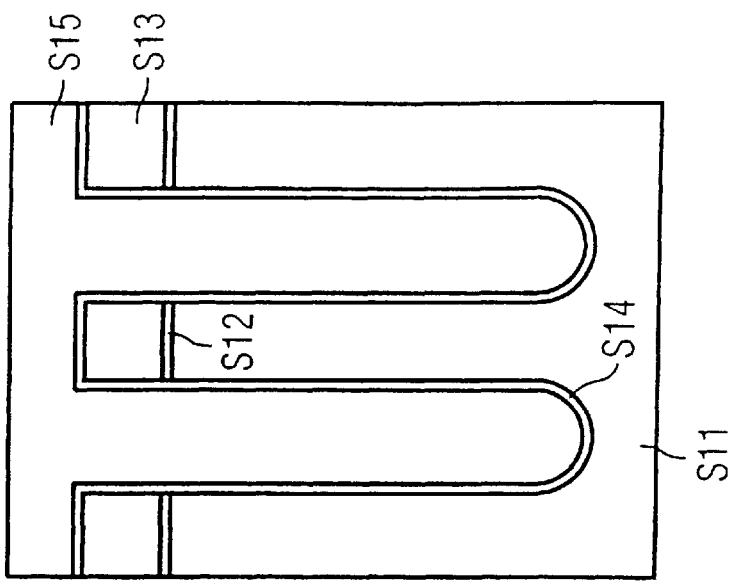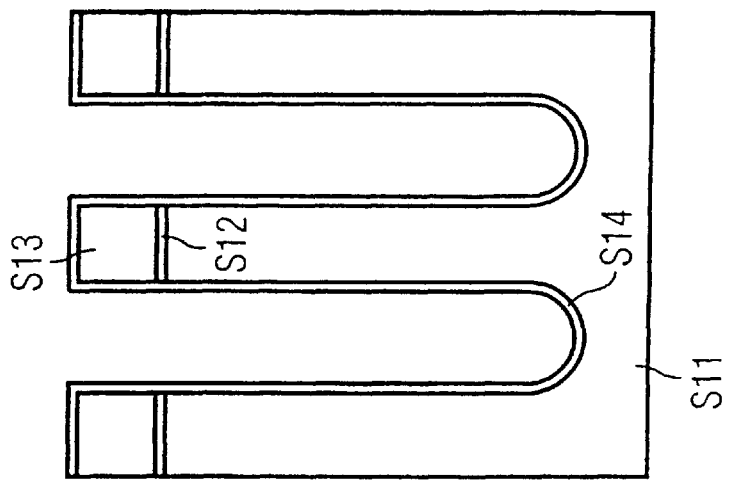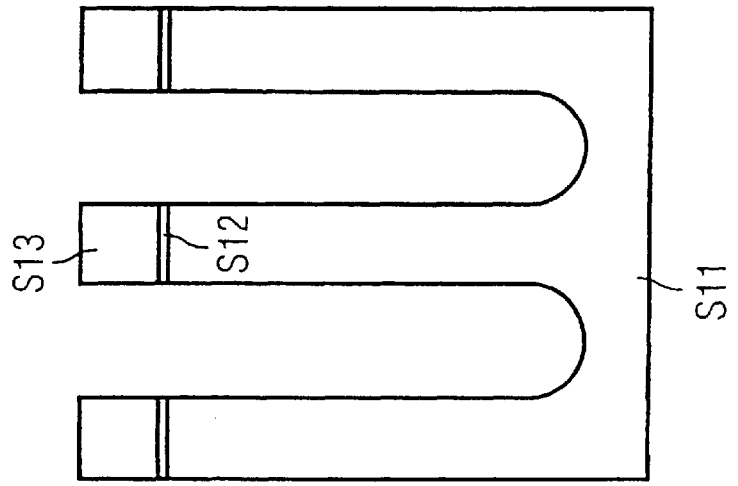

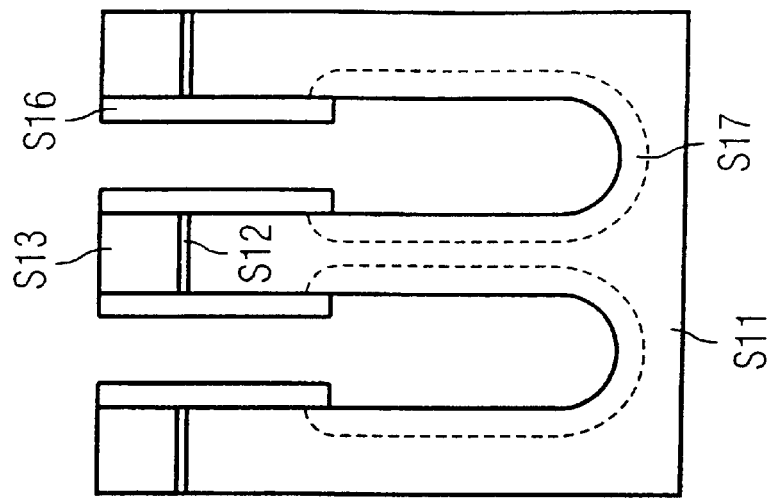
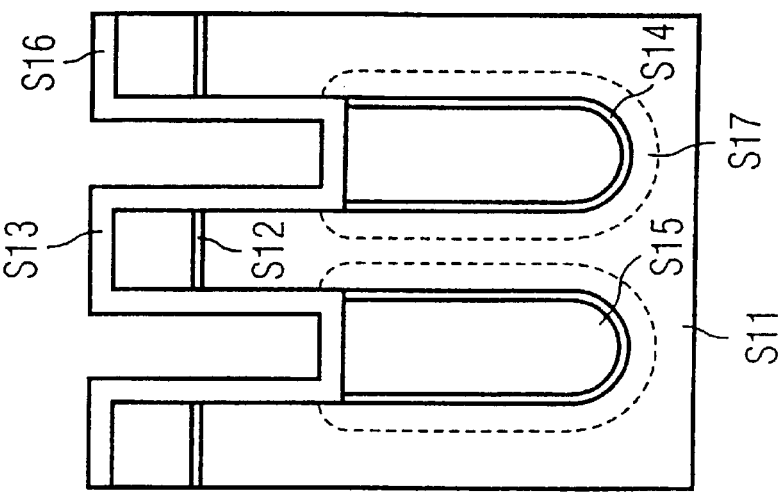
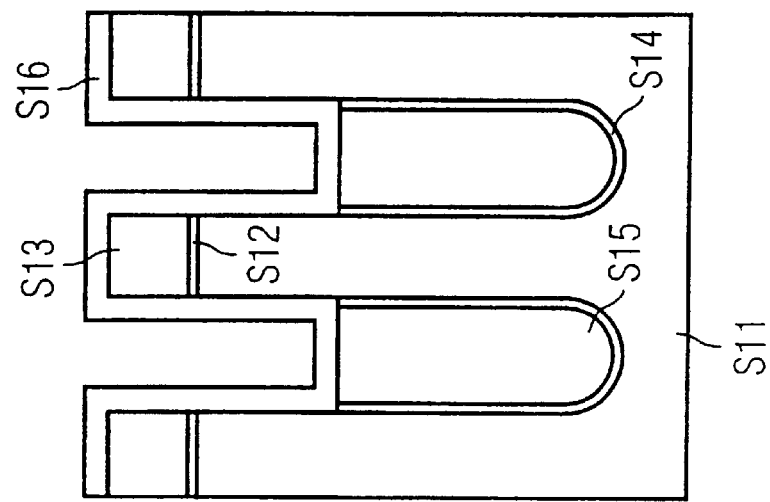

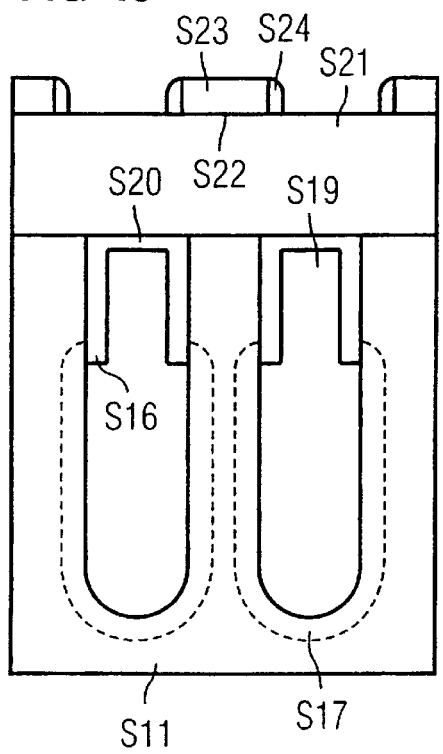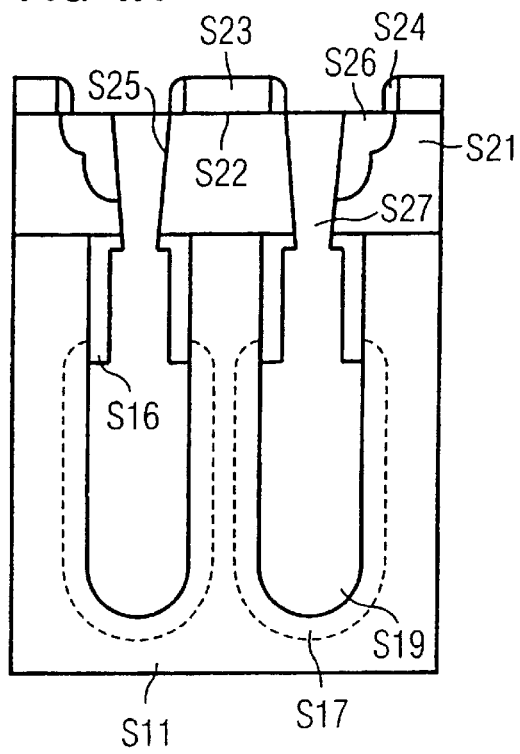

TRENCH CAPACITOR HAVING AN INSULATION COLLAR

BACKGROUND OF THE INVENTION

Field of the Invention

The present invention relates to a trench capacitor and to a method of producing a trench capacitor.

A conventional trench capacitor and a corresponding method of producing such a trench capacitor are disclosed in U.S. Pat. No. 6,018,174.

In integrated circuits (ICs), capacitors are generally used to store electrical charges. For example, the dynamic read/write memories (DRAMs) of memory ICs are each composed of a select transistor and a storage capacitor. The information is stored in the storage capacitor in the form of electrical charges. The memory states "0" and "1" correspond respectively to a positively and negatively charged storage capacitor. A memory IC generally has a matrix of such DRAM cells, which are wired in the form of rows and columns. The row connections are usually referred to as word lines and the column connections are referred to as bit lines. The select transistor and the storage capacitor in the individual DRAM cells are in this case interconnected in such a way that when the select transistor is driven via a word line, the charge on the storage capacitor can be read in and out via a bit line.

One focus in the development of the technology of memory ICs with DRAMs is the storage capacitor. In order to obtain an adequate read signal from this storage capacitor and to make it insensitive to α-particles, a storage capacity of 20 to 40 fF is required. In order to ensure such an adequate storage capacity in the cell area of the DRAMs, which is decreasing continually from technology step to technology step, storage capacitors have therefore been developed which make use of the third dimension.

Such three-dimensional storage capacitors in DRAM cells are configured either as stacked capacitors or as trench capacitors. Capacitors are composed basically of two conductive layers which are provided one above the other and are separated by a dielectric intermediate layer. Stacked capacitors in DRAM cells are placed on the generally planar select transistors, a conductive capacitor layer having an electrical connection to the select transistor.

Alternatively, three-dimensional storage capacitors are configured as trench capacitors. Trench capacitors are normally produced in such a way that, first of all, deep trenches are etched into the semiconductor substrate. These trenches are then lined with a dielectric layer, for example a nitride, and are then filled with a capacitor electrode, also referred to as a "storage electrode," for example an $n^+$-doped polysilicon. In the semiconductor substrate, a second capacitor electrode, also referred to as a "buried plate", is formed, for example by outward diffusion of n-doping atoms from a dopant source in the region around the lower portion of the trench. The select transistor of the DRAM cells is then usually produced on the planar semiconductor surface beside the trench capacitor. In this case, the select transistor generally has two highly doped diffusion regions which are separated by a channel region, one diffusion region being connected to a bit line of the DRAM via a contact layer. On the other hand, the other diffusion region is connected via a capacitor connecting region to the capacitor electrode, which is formed in the interior of the trench. The channel of the select transistor is additionally separated, by a gate dielectric layer, from a gate electrode layer, which is connected to a word line of the DRAM cell. A procedure of reading into and out from the DRAM cell is controlled by the word line in such a way that, by applying a voltage to the gate electrode layer, a current-carrying channel is produced between the diffusion regions of the select transistor, so that information in the form of charges can be read into and out from the capacitor electrode in the trench via the capacitor terminal.

In the upper region of the trench of the trench capacitor, adjacent to the storage dielectric, an insulation layer, a "collar," is additionally formed. This collar is intended to prevent a leakage current arising between the capacitor terminal and the buried plate which forms the outer electrode of the trench capacitor. Such a leakage current would shorten the retention time of the charges in the trench capacitor considerably and, therefore, increase the necessary refresh frequency of the DRAM cell in an undesired manner. The collar in the upper region of the trench is generally produced as an isolating oxide or nitride layer, which must be sufficiently thick in order to prevent a possible parasitic transistor parallel to the trench. The thickness and the material of the collar are in this case determined by the operating voltage used for the select transistor and the material properties of the surrounding layers. In the case of DRAM cells produced by silicon planar technology, a layer thickness of typically 25 nm is necessary when oxide is used as the collar material, in order to raise the turn-on voltage of the possible parasitic transistor along the trench above the operating voltage of the select transistor. However, a collar formed with such a thickness in the upper region of the trench restricts the access to the storage electrode in the lower trench region by narrowing the trench diameter sharply and, in addition, makes its formation more difficult.

Because of the continuously increasing reduction in the size of the DRAM cells, the cell areas for the trench capacitor, and therefore also the trench diameters, decrease from DRAM generation to DRAM generation. In order to ensure a constant capacitor capacitance of 20 fF to 40 fF, even with a reduced trench diameter, there is the possibility of increasing the depth of the trenches, but in the meantime this also runs up against both technological and economic limits. Firstly, the production of increasingly deeper trenches with a simultaneously reduced trench diameter requires new and expensive etching processes, which permit a very high aspect ratio (ratio of column depth to column width). In addition, starting from a specific trench depth, a considerably prolonged etching time results, which increases the costs of the etching process significantly and makes the subsequent formation of the dielectric layer and of the electrode more difficult or impossible.

Alternatively and additionally to further deepening of the trenches, methods are therefore increasingly being used which permit the surface within the trench capacitor to be enlarged, in order in this way to ensure an adequate storage capacity. For example, in particular the trench is widened in a lower region through the use of an additional etching step, which means that the storage electrode area of the trench capacitor may be enlarged.

However, one problem in the development of the trench capacitors continues to be presented by the upper trench region, which cannot be widened because of the predefined cell area, and in which the dielectric collar for preventing the parasitic select transistor along the trench is formed. Since this collar is to have a substantially constant thickness, even in the case of future DRAM generations, because of the operating voltages used for the select transistors, increased narrowing of the connection between the inner storage electrode in the trench and the select transistor occurs and, in the extreme case, can lead to the connection being cut off.

SUMMARY OF THE INVENTION

It is accordingly an object of the invention to provide a storage capacitor, and more specifically a trench capacitor structure with an insulation collar and a DRAM cell with such a trench capacitor, as well as a method for its production which overcome the above-mentioned disadvantages of the heretofore-known methods and devices of this general type and which, even in the case of a trench area of very small dimensions, avoids a leakage current between the capacitor terminal and the buried plate and also ensures a reliable electrical connection of the inner storage electrode in the trench.

With the foregoing and other objects in view there is provided, in accordance with the invention, a storage capacitor, including:

a semiconductor substrate formed with a trench having a trench wall, the trench having a lower portion and an upper portion, the trench being a bottle-shaped trench with the lower portion being wider than the upper portion, and the trench wall having an upper and a lower section in the lower portion of the trench;

an outer electrode layer formed around the lower portion of the trench;

a dielectric intermediate layer formed in the lower section of the trench wall;

an inner electrode layer substantially filling the trench; and a thick insulation layer provided in the upper section of the trench wall, and the thick insulation layer adjoining the dielectric intermediate layer.

According to the invention, the storage capacitor or trench capacitor is formed with a trench in a semiconductor substrate, which is configured like a bottle with a wider lower region and a narrower upper region, an outer electrode layer in the semiconductor substrate being formed around a lower section of the wider lower region of the trench, a dielectric intermediate layer being provided on the lower section of the trench wall in the wider lower region of the trench, a thick insulation layer adjoining the dielectric intermediate layer being provided on an upper section of the trench wall in the wider lower region of the trench.

The term "thick insulation layer" is defined as an insulation layer that is sufficiently thick to substantially prevent a leakage current between the capacitor terminal and the outer electrode of the trench capacitor.

This construction means that the thick insulation layer, which forms the insulation collar which serves to raise the turn-on voltage of a possible parasitic vertical transistor along the trench above the operating voltage of a select transistor in the semiconductor memory cell, is not implemented in the upper trench region but buried in a lower, broadened subsection of the trench. As a result of the buried configuration of the insulation collar, it is possible to form this region in a broadened way in the trench, and therefore to prevent the access to the internal electrode layer being cut off. As a result of the large trench diameter, the series resistance to the connection of the internal capacitor electrode is kept low, and therefore ensures a low contact resistance. The upper trench region can therefore basically be configured to be narrow, so that it is possible to reduce the required area for forming the semiconductor memory cell significantly, since the trench capacitor has only a small surface in the active region, in which the associated select transistor of the memory cell is formed. As a result of the buried configuration of the collar layer in the broadened trench region, it is additionally possible to fill the trench with the dielectric intermediate layer and the internal electrode layer simply and reliably.

In addition, the configuration according to the invention of the trench capacitor with a buried insulation collar is compatible with the DRAM process sequences which are known at present, as a result of which only a low additional expenditure on the process is required for the configuration according to the invention of the trench capacitors. Using the configuration according to the invention, trench capacitors with insulation collars can be used, in particular even in semiconductor memory cells in the sub-100 nm range.

According to another feature of the invention, a further insulation layer is formed on the trench wall in the upper portion of the trench, the further insulation layer is thinner than the thick insulation layer, and the further insulation layer adjoins the thick insulation layer and forms a continuous surface with the thick insulation layer.

According to yet another feature of the invention, the thick insulation layer and the further insulation layer are formed of an oxide or a nitride.

With the objects of the invention in view there is also provided, a storage capacitor, including:

a semiconductor substrate formed with a trench having a trench wall, the trench having a lower portion and an upper portion, and the trench wall having an upper and a lower section in the lower portion of the trench;

an outer electrode layer formed around the lower portion of the trench;

a dielectric intermediate layer formed in the lower section of the trench wall;

an inner electrode layer substantially filling the trench; and an insulation layer provided in the upper section of the trench wall, the insulation layer adjoining the dielectric intermediate layer and having a given thickness selected such that a parasitic transistor current along the trench is substantially prevented.

More specifically, the insulation layer is configured such that the given thickness is selected such that a turn-on voltage for the parasitic transistor current along the trench is raised above an operational voltage (e.g. bit line voltage) to be applied to the inner electrode layer or the outer electrode layer.

With the objects of the invention in view there is also provided, a method of producing a storage capacitor, the method includes the steps of:

forming a bottle-shaped trench in a semiconductor substrate, the bottle-shaped trench having a relatively wider lower portion and a relatively narrower upper portion;

forming an outer electrode layer in the semiconductor substrate around a lower section of the relatively wider lower portion of the bottle-shaped trench;

forming a dielectric intermediate layer on a wall of the bottle-shaped trench in the lower section of the relatively wider lower portion of the bottle-shaped trench;

forming a thick insulation layer on the wall of the bottle-shaped trench in an upper section in the relatively wider lower portion of the bottle-shaped trench such that the thick insulation layer adjoins the dielectric intermediate layer; and substantially filling the bottle-shaped trench with an inner electrode layer.

According to another mode of the invention, the bottle-shaped trench is formed in a two-stage etching process by firstly etching a trench having a width of the relatively narrower upper portion, and subsequently widening the trench in the relatively wider lower portion.

According to yet another mode of the invention, a further insulation layer, which is thinner than the thick insulation layer, is formed on the wall of the bottle-shaped trench in the relatively narrower upper portion of the bottle-shaped trench such that the further insulation layer adjoins the thick insulation layer and such that the thick insulation layer and the further insulation layer form a continuous surface.

With the objects of the invention in view there is also provided, a method of producing a storage capacitor, the method includes the steps of:

forming a trench in a semiconductor substrate, the trench having a lower portion and an upper portion;

forming an outer electrode layer in the semiconductor substrate around a lower section of the lower portion of the trench;

forming a dielectric intermediate layer on a wall of the trench in the lower section of the lower portion of the trench;

forming an insulation layer on the wall of the trench in an upper section of the lower portion of the trench, the insulation layer adjoining the dielectric intermediate layer and having a given thickness selected such that a parasitic transistor current along the trench is substantially prevented; and substantially filling the trench with an inner electrode layer.

Other features which are considered as characteristic for the invention are set forth in the appended claims.

Although the invention is illustrated and described herein as embodied in a trench capacitor having an insulation collar, and a method of producing such a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A to 3I are diagrammatic, partial cross-sectional views of a semiconductor structure for illustrating a first embodiment of a method according to the invention for producing a trench capacitor in accordance with the standard DRAM process sequence; and FIGS. 4A to 4K are diagrammatic, partial cross-sectional views of a semiconductor structure for illustrating a second embodiment of a method according to the invention for producing a trench capacitor in accordance with the DOT-DRAM process sequence.

DESCRIPTION OF THE PREFERRED EMBODIMENTS

Referring now to the figures of the drawings in detail, the invention will be explained in view of the production of trench capacitors within the context of a process sequence for forming DRAM memory cells based on silicon. The trench capacitors according to the invention can, however, also be used in other highly integrated circuits in which storage capacitors are needed. The formation of the trench capacitors is preferably carried out using planar technology, which includes a sequence of individual processes which in each case act on the entire area of the wafer surface, a local change in the silicon substrate being made specifically through the use of suitable masking steps. In DRAM production, a large number of cells with appropriate trench capacitors is formed simultaneously. In the following text, however, the invention will be presented only with regard to the formation of a single trench capacitor.

Figure 1:
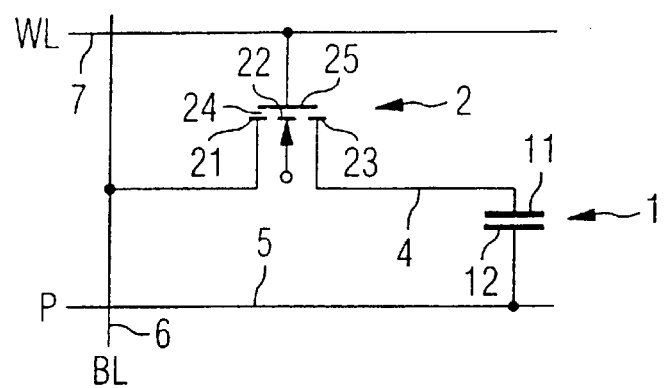
FIG. 1 is a schematic circuit diagram of a DRAM cell.

It is predominantly single-transistor cells which are used in DRAM memories, their circuit diagram being shown in FIG. 1. These transistor cells include a storage capacitor 1 and a select transistor 2. The select transistor 2 is preferably constructed as a field effect transistor and has a first electrode 21 and a second electrode 23, between which an active region 22 is provided, in which a current-carrying channel can be formed between the first electrode 21 and the second electrode 23. Provided above the active region 22 are an isolator layer 24 and a gate electrode 25, which act like a plate capacitor, with which the charge density in the active region 22 can be influenced.

The second electrode 23 of the select transistor 2 is connected via an electrical connection 4 to a first electrode 11 of the storage capacitor 1. A second electrode 12 of the storage capacitor 1 is in turn connected to a conductive connection (P) 5, which is preferably common to all the storage capacitors in the DRAM memory. The first electrode 21 of the select transistor 2 is also connected to a bit line 6, in order to be able to read in or out the information stored in the form of charges in the storage capacitor 1. Here, the reading in or reading out operation is controlled via a word line (WL) 7, which is connected to the gate electrode 25 of the select transistor 2, in order to produce a current-carrying channel in the active region 22 between the first electrode 21 and the second electrode 23 by applying a voltage.

In DRAM memories, trench capacitors are often used, since their three-dimensional structure permits a significant reduction in the size of the DRAM cell area and, at the same time, ensures simple production within the context of silicon planar technology. With trench capacitors, it is in particular also possible to achieve a capacitor capacitance of about 25 to 50 fF, which is needed in order to obtain an adequate read signal for the DRAM cells.

Conventional trench capacitors have a trench which is etched into the silicon substrate and typically is filled with a highly doped polysilicon, which represents the first electrode 11 in the circuit diagram in FIG. 1. In addition, the second electrode 12, also referred to as the "buried plate", is formed by introducing doping atoms into the lower region of the trench. Provided between the two capacitor electrodes is a storage dielectric layer which, for example, contains nitride, in order to isolate the two capacitor electrodes from each other. In order to prevent a leakage current from the capacitor terminal via the electrical connection 4 to the buried plate 12, an insulation layer, also called an insulation collar, is also provided. This insulation collar, which is preferably composed of $SiO_2$, must be sufficiently thick to raise the turn-on voltage of an undesired parasitic transistor along the trench above the operating voltage of the DRAM cell. As trench diameters become smaller and smaller because of the restricted DRAM cell area, there is therefore the risk of cutting off the electrical contact between the select transistor 2 and the electrode 11 in the trench of the storage capacitor 1.

Figure 2:
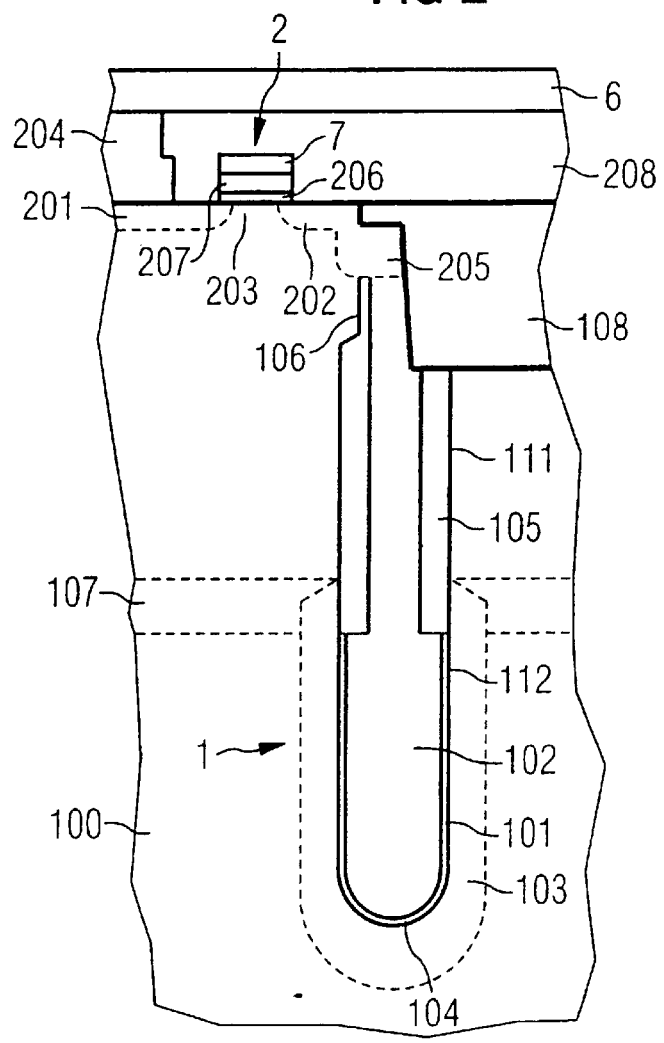
FIG. 2 is a diagrammatic, partial cross-sectional view of a DRAM cell having a trench capacitor according to the invention.

FIG. 2 shows a possible embodiment of a trench capacitor 1 according to the invention, in which any cutting off by the insulation collar in the upper trench region is prevented. Here, the trench capacitor is formed in a preferably monocrystalline silicon substrate 100. The substrate is preferably weakly p (p⁻)-doped, for example with boron (B). Formed in the silicon substrate 100 is a trench 101, which is composed of a narrower upper trench region 111 and a wider lower trench region 112. A trench form of this type can be formed, for example, through the use of a two-stage etching process, which results in the bottle shape of the trench shown in FIG. 2. Formed around a first lower portion at the lower region 112 of the trench 101 is a highly n (n⁺)-doped layer 103, which, for example, is doped with arsenic. This n⁺-doped layer 103 constitutes, as a buried plate, the outer capacitor electrode of the trench capacitor 1.

The trench 101 made in the silicon substrate 100 is filled with an n⁺-doped layer 102, for example polysilicon, which, for example, is doped with arsenic (As) or phosphorus (P) or a metal. This trench filling 102 forms the inner electrode of the storage capacitor 1, also referred to as the "storage electrode", and produces the connection to the select transistor 2. Between the n⁺-doped layer 103 and the n⁺-doped trench filling 102, in the lower portion of the lower region 112 of the trench 101, a dielectric layer 104 is formed on the wall of the trench and isolates the capacitor electrodes from each other. The storage dielectric 104 can in this case is formed of a stack of dielectric layers, for example oxide, nitride-oxide or oxide-nitride-oxide or another material with a high dielectric constant. As a result of the widening of the trench 101 in the lower trench region 112, an enlargement of the surfaces between the capacitor electrodes is achieved, which permits the capacitor capacitance to be increased.

The select transistor 2 of the DRAM cell in the embodiment shown in FIG. 2 has two diffusion regions 201, 202, which are produced by implanting n-doping atoms in the silicon substrate 100 and are separated by a channel 203. The first diffusion region 201 serves as a first electrode 21 of the select transistor 2 and is connected to the bit line (BL) 6 via a contact layer 204. The second diffusion region 202 is connected by a capacitor connecting layer 205 to the n⁺-doped filling layer 102 which forms the storage electrode 12 of the trench capacitor 1. The channel 203 is further separated by a dielectric layer 206 from a gate electrode layer 207, which is part of the word line 7.

In the lower broadened region 112 of the trench 101, in an upper portion adjoining the dielectric layer 104, an insulation layer 105 is provided between the trench wall and the filling layer 102 of the trench capacitor. This insulation layer 105 prevents a parasitic transistor being formed along the trench 101 between the capacitor connecting layer 205 and the buried plate 103; the transistor would give rise to an undesired leakage current, which would significantly reduce the retention time of the charges in the trench capacitor and therefore, in an undesired way, would increase the necessary refresh frequency of the DRAM cells. The insulation layer 105 is preferably formed by an oxide or nitride, which is deposited and/or grown on in the upper portion of the lower region 112 of the trench 101. The thickness and the material of the insulation layer 105 is in this case determined by the bit-line voltage of the select transistor 2 and the material characteristics of the various surrounding semiconductor layers. The insulation collar 105 must be sufficiently thick to raise the turn-on voltage of the parasitic select transistor along the trench above the bit-line voltage of the transistor. The insulation collar 105 is optionally adjoined in the narrower, upper region 111 of the trench 101 by a further thin insulation layer 106 which, if necessary, ensures that the filling layer 102 in the upper trench region 112 is electrically isolated from the silicon substrate 100.

Also provided in the silicon substrate 100 is an n-doped well or trough 107, which serves as a connection between the buried plate 103 and the buried plates of the further DRAM memory cells. In order to insulate the DRAM cells from one another, an insulation trench 108 (STI insulation) is formed. The gate electrode layer 207 and the word line 7 are further isolated from the bit line 6 and the contact layer 204 to the first diffusion region 201 by an oxide layer 208. A read-in and read-out operation in the DRAM cell is controlled by the word line 7, which is connected to the gate electrode layer 207 of the select transistor 2, in order, as a result of applying a voltage, to produce a current-carrying channel 203 between the diffusion regions 201, 202, so that information in the form of charges can be read into and out from the filling layer 102 of the trench capacitor via the connecting layer 205.

By forming the insulation collar 105 as a buried layer in an upper portion of a region 112 of the trench 101 which is widened at the bottom, the inner filling layer 102, which serves as a storage electrode of the trench capacitor, is prevented from being cut off on account of the necessary thickness of this insulation collar. The access region to the storage electrode therefore remains sufficiently wide to ensure a low series resistance, and therefore good electrical contact making. In addition, there is the possibility of reducing the diameter of the trench 101 in the upper region 111, in which only a thin isolator layer 106 is required for the electrical insulation of the filling layer 102 of the trench capacitor from the surrounding silicon substrate 100, in such a way that only a small surface is required for the trench in this active region on the surface of the silicon substrate 100, in which the select transistor 2 is formed.

The configuration according to the invention of the trench capacitor with a buried collar insulation layer can, moreover, be integrated simply into the known DRAM process sequences. In the following text, the production of a trench capacitor with a buried insulation collar within the context of two DRAM process sequences will be presented. However, there is also the possibility of carrying out the formation of the trench capacitor with a buried insulation collar through the use of other known DRAM process sequences.

FIGS. 3A to 3I show a first method of producing a trench capacitor with a buried insulation collar within the context of a standard DRAM process sequence.

As FIG. 3A shows, the trenches for the trench capacitors are formed in a p⁻-doped silicon substrate S1 in a first process step. To this end, an oxide layer S2 and a nitride layer S3 are produced successively on the silicon surface. Then, by using a mask layer, the areas of the trench capacitors on the silicon surface are defined in a known manner, and trenches with a depth of about 1 μm are then produced through the use of first anisotropic etching.

In a next process step, a thin nitride layer S4 is deposited in the trench, and, as FIG. 3B shows, is structured with a mask process and subsequent etching process such that it remains only in the upper region of the trench wall. Here, the nitride layer S4 preferably extends from the silicon surface down to a depth of about 100 to 200 nm in the trench. As FIG. 3C shows, the nitride layer S4 serves as an etching mask for a second etching operation, in which the trenches are widened in the lower trench region. Following this trench widening in the lower region, as shown in FIG. 3D, there follows a further deposition of a thin nitride layer S5, which covers the entire trench surface. The trenches are then filled with polysilicon S6, which then, as shown in FIG. 3E, is etched back again to such an extent that only a lower portion of the widened trench region remains filled with this polysilicon layer S6.

In a further process sequence, as shown in FIG. 3F, conformal deposition of a thick oxide layer S7 over the entire silicon surface is performed, oxide formation in particular also being carried out on the trench wall. This oxide layer S7 is then etched anisotropically, so that the oxide layer S7 remains only in the upper portion of the lower widened trench region, as shown by the cross section through the silicon wafer in FIG. 3G.

Then, in a next process step, the polysilicon filling S6 is removed completely from the trenches again, and the nitride layer S5 in the lower portion of the broadened trench region is etched away. In a further process sequence, an $n^+$-doped buried plate S8 is formed. To this end, for example an arsenic glass (ASG) layer is deposited over the trench wall, from which arsenic is diffused outward into the silicon substrate S1 by heating, so that the result is the $n^+$-doped layer S8 in the lower portion of the widened region of the trench. This layer S8 serves as the buried plate of the trench capacitor.

In a further process sequence, an NO layer S9 is deposited as a storage dielectric on the silicon surface, and then the trenches are filled with $n^+$-doped polysilicon S10, which serves as a storage electrode of the trench capacitor. A cross section through the silicon wafer after this process step is shown in FIG. 3I.

In a further process sequence, the select transistor is then produced beside the trench capacitor, a "buried strap", that is to say a connection between the polysilicon filling S10 in the trench, which serves as the storage electrode, and a diffusion region of the select transistor being produced.

Through the use of the method illustrated, a buried insulation collar is produced in a simple way in a widened part of the trench. In particular, it is possible to integrate this buried configuration of the insulation collar into a standard DRAM production process with only a few additional process steps.

FIGS. 4A to 4K show a second method of producing a trench capacitor with a buried insulation collar within the context of a device-on-trench (DOT)-DRAM process sequence, as it is known. In the case of this DRAM process sequence, in order to save memory cell area, the select transistor is provided above the trench capacitor.

After the etching of trenches into a silicon substrate S11, which is shown in FIG. 4A and in which the trenches are formed via a lithography step with a mask of an oxide layer S13 and a nitride layer S12, an arsenic glass layer S14 is then deposited, as shown in FIG. 4B. Then, as shown in FIG. 4C, the trenches are filled with an undoped polysilicon layer S15, which is then etched back, so that only the lower region of the arsenic glass layer S14 remains covered. Following the removal of the arsenic glass layer S14 in the exposed upper trench region, a thick oxide layer S16 is deposited on the silicon surface, as shown in FIG. 4D. Then, through the use of heating, the arsenic is driven out of the arsenic glass layer S14 into the silicon substrate S11, so that an $n^+$-doped buried plate S17 is produced, as shown in FIG. 4E.

The thick oxide layer S16 is then etched anisotropically, so that it remains only on the trench side walls. The polysilicon filling S15 is then again completely removed from the trenches, and the remaining arsenic glass layer S14 is etched away. A cross section through the silicon wafer after this process step is shown in FIG. 4F. The thick oxide layer S16 on the trench side walls forms the insulation collar for avoiding an undesired parasitic select transistor along the trench. As FIG. 4G shows, an NO layer S18 is then deposited as a storage dielectric on the surface of the wafer, and the trenches are then filled with $n^+$-doped polysilicon S19.

Figure 4I:
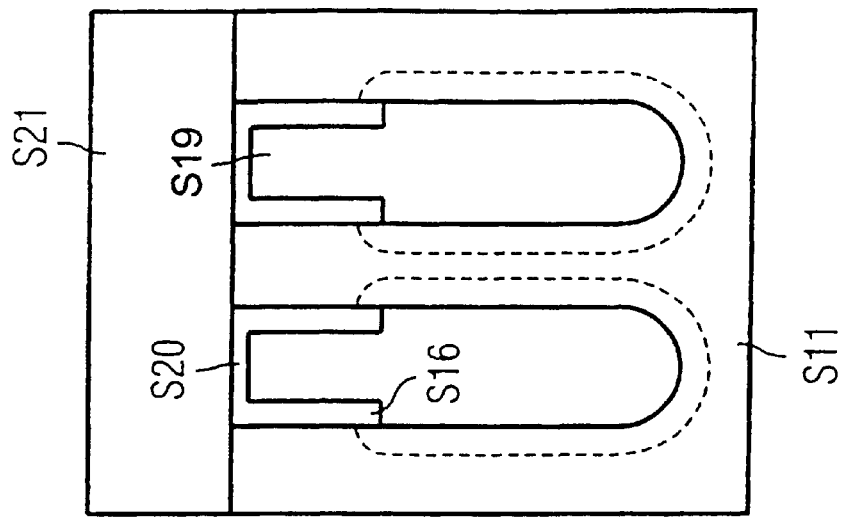
Figure 4H:
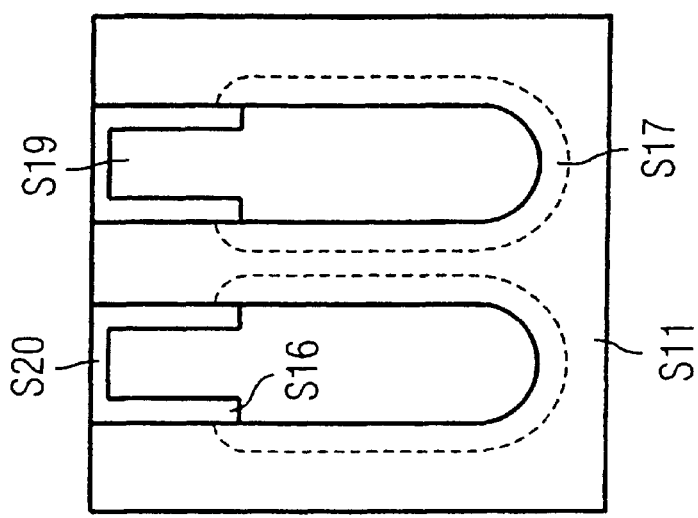
Figure 4G:
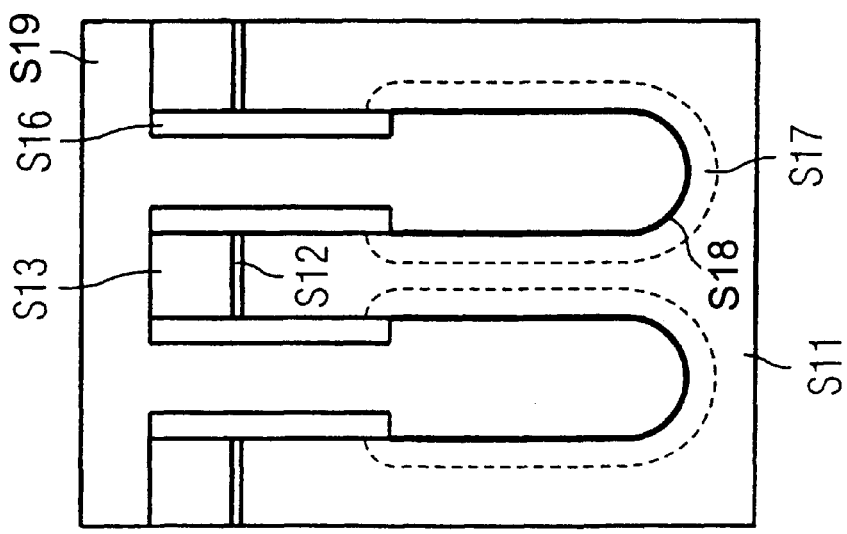

In a further process sequence, which is shown in FIGS. 4H to 4K, the select transistor is then formed on the trench capacitor. To this end, in a first step, as shown in FIG. 4H, the polysilicon filling S19 is etched back to just below the trench surface, and the trench is then covered with an oxide layer S20. Then, preferably by selective epitaxy, as shown in FIG. 4I, silicon S21 is grown on the entire surface of the wafer. Then, in a process sequence on the surface of the wafer, a gate dielectric S22 is produced and, following that, a gate electrode layer S23 is applied, being delimited by spacers S24. A cross section through the wafer after this process step is shown in FIG. 4J.

Then, through the use of a subsequent etching process, the epitaxial layer S21 and the oxide layer S20 over the trench are opened again, a thin oxide layer S25 is then deposited in the wall of the opening, and this oxide layer S25 is then opened again in a lateral region. Then, in a two-stage process sequence, firstly an $n^+$-diffusion region S26 is formed on the silicon surface with contact with the trench opening, and then the trench opening is filled again with an $n^+$-doped polysilicon S27. In a further process sequence, not shown, the further diffusion regions and layers required for the select transistor are then produced.

With the aid of the methods according to the invention presented, the formation of trench capacitors with a buried insulation collar in a DOT-DRAM production process is possible. The two methods presented are, however, not restricted to a DRAM production process, but can also be used to form all other known semiconductor components with trench capacitors.

It is also within the scope of the invention, going beyond the exemplary embodiments mentioned above, to modify the specified dimensions, concentrations, materials and processes in a suitable manner in order to produce the trench capacitor according to the invention with a buried insulation collar. In particular, in this case all known process sequences for forming trench capacitors within the context of DRAM production processes may be used. In addition, there is the possibility of implementing the conductivity type of the doped regions in the component structure in a complementary fashion. Furthermore, the materials specified for forming the various layers can be replaced by other materials known in this connection. In this case, nitride layers, in particular, can also be used instead of an oxide layer as an insulation collar. Furthermore, in addition to the semiconductor layers illustrated, further sequences of layers can be introduced into the semiconductor structure, for example in order to form barriers to prevent undesired diffusion. In addition, these mask sequences in the structuring processes presented can be modified in a suitable way, without leaving the scope of the invention.

The features of the invention disclosed in the above description, the drawings and the claims may be of significance, both individually and in any desired combination, for the implementation of the invention in its various configurations.

I claim:

1. A storage capacitor, comprising:
   a semiconductor substrate formed with a trench having a trench wall, said trench having a lower portion and an upper portion, said trench being a bottle-shaped trench with said lower portion being wider than said upper portion, and said trench wall having an upper and a lower section in said lower portion of said trench, said upper section and said lower section of said lower portion being wider than said upper portion of said trench;

an outer electrode layer formed around said lower portion of said trench;

a dielectric intermediate layer formed in said lower section of said trench wall;

an inner electrode layer substantially filling said trench; and a single uniform thick insulation layer disposed completely on said upper section of said trench wall in said lower portion of said trench, said thick insulation layer adjoining said dielectric intermediate layer, and said thick insulation layer being formed of a material selected from the group consisting of an oxide and a nitride.

2. The storage capacitor according to claim 1, including:

a further insulation layer formed on said trench wall in said upper portion of said trench, said further insulation layer being thinner than said thick insulation layer; and said further insulation layer adjoining said thick insulation layer and forming a continuous surface with said thick insulation layer.

3. The storage capacitor according to claim 2, wherein said thick insulation layer and said further insulation layer are formed of a material selected from the group consisting of an oxide and a nitride.

4. A storage capacitor, comprising:

a semiconductor substrate formed with a trench having a trench wall, said trench having a lower portion and an upper portion, and said trench wall having an upper and a lower section in said lower portion of said trench, said upper section and said lower section of said lower portion being wider than said upper portion of said trench;

an outer electrode layer formed around said lower portion of said trench;

a dielectric intermediate layer formed in said lower section of said trench wall;

an inner electrode layer substantially filling said trench; and a single uniform thick insulation layer disposed completely on said upper section of said trench wall in said lower portion of said trench, said insulation layer adjoining said dielectric intermediate layer and having a given thickness selected such that a parasitic transistor current along said trench is substantially prevented, and said thick insulation layer being formed of a material selected from the group consisting of an oxide and a nitride.

5. The storage capacitor according to claim 4, including:

a further insulation layer formed on said trench wall in said upper portion of said trench; and said further insulation layer adjoining said insulation layer, and said further insulation layer being thinner than said insulation layer and forming a continuous surface with said insulation layer.

6. The storage capacitor according to claim 5, wherein said insulation layer and said further insulation layer are formed of a material selected from the group consisting of an oxide and a nitride.

7. The storage capacitor according to claim 4, wherein said insulation layer is configured such that said given thickness is selected such that a turn-on voltage for the parasitic transistor current along said trench is raised above an operational voltage to be applied to an electrode selected from the group consisting of said inner electrode layer and said outer electrode layer.

* * * * *